United States Patent [19]
Yokouchi et al.

[11] Patent Number: 5,666,375
[45] Date of Patent: Sep. 9, 1997

[54] SEMICONDUCTOR QUANTUM WELL LASER HAVING A LOW THRESHOLD CURRENT DENSITY

[75] Inventors: Noriyuki Yokouchi; Nobumitsu Yamanaka, both of Kanagawa; Akihiko Kasukawa, Tokyo, all of Japan

[73] Assignee: The Furukawa Electric Co., Ltd., Chiyoda-ku, Japan

[21] Appl. No.: 555,472

[22] Filed: Nov. 8, 1995

[30] Foreign Application Priority Data

Nov. 8, 1994 [JP] Japan .................................. 6-274079

[51] Int. Cl.$^6$ ........................................ H01S 3/19
[52] U.S. Cl. ................................................ 372/45
[58] Field of Search ........................... 372/45; 359/248

[56] References Cited
PUBLICATIONS

Seki et al., "Pure Strain Effect on Differential Gain of Strained InGaAsP/InP Quantum–Well Lasers" IEEE Photonics Technology Letters, vol. 5, No. 5, pp. 500–503 May 1993.

*Primary Examiner*—Rodney B. Bovernick
*Assistant Examiner*—Luong-Quyen T. Phan
*Attorney, Agent, or Firm*—Helfgott & Karas, P.C.

[57] ABSTRACT

The present invention gives rise to a 1.3 μm tensile-strained quantum well laser having a quantum well active layer which can be structurally specified as $In_{1-x}Ga_xAs_yP_{1-y}$ with X between 0.42 and 0.55 and Y between 0.8 and 0.75. The InGaAsP active layer needs to have a tensile stress between 1.0 and 1.5% and can be fabricated without any substantial phase-separation between InP and GaAs. The 1.3 μm tensile-strained quantum well laser is equipped with a remarkably meager threshold current density of less than 0.2 kA/cm$^2$. The preferable tensile strain ranges between from 1.2 to 1.4% or thereabout.

4 Claims, 2 Drawing Sheets

SEMICONDUCTOR QUANTUM WELL LASER HAVING A LOW THRESHOLD CURRENT DENSITY

BACKGROUND OF THE INVENTION

1. Field of the Invention

The present invention relates to a semiconductor quantum well laser having a low threshold current density and, more particularly, to a semiconductor quantum well laser lasing at a wavelength of around 1.3 µm.

2. Description of the Related Art

A 1.3 µm semiconductor laser lasing at a wavelength of around 1.3 µm and composed of indium phosphide/indium gallium-arsenide phosphide (InP/InGaAsP) is generally used for a light source of a subscriber line in an optical communication network. This type of the semiconductor laser, however, has a disadvantage in a high threshold current density rated at up to 0.5 kA/cm$^2$. Accordingly, a 1.3 µm semiconductor laser is desired to lase at a lower threshold current, in view of power saving.

On the other hand, in the case of a 1.5 µm InP/InGaAsP semiconductor laser lasing at a wavelength of around 1.5 µm, it is known that a semiconductor laser of this type has excellent characteristics of a low threshold and a high quantum efficiency, where the quantum well active layers are subjected to tensile strain.

For example, it is reported in literatures that a quantum well laser lasing at a wavelength of around 1.5 µm exhibits a minimum threshold current density as low as 90 ampere/cm$^2$ (A/cm$^2$) by applying InGaAs compound having a tensile strain of around 1.5% for quantum well layers. Examples of the literatures include "Low threshold 1.5 µm tensile-strained single quantum well lasers". Electron, lett., 27, pp 1414–1416, 1991, presented by C. E. Zah, R. Bhat, B. Pathak, C. Caneau, F. J. Favire, N. C. Andreadakis, D. M. Hwang, M. A. Koza, C. Y. Chen, and T. P. Lee and "Submilliamp threshold current (0.62 mA at 0° C.) and high output power (220 mW) 1.5 µm tensile strained InGaAs single quantum well lasers", Electron Lett., 28, pp 829–830, 1992, presented by P. J. A. Thijs, J. J. M. Binsma, L. F. Tiemeijer and T. van Dongen.

This literature cast light on a fact that tensile strain applied on InGaAsP layers serving as quantum well layers in a semiconductor laser affects the band structure of the valence band of the quantum well lasers; as a result, the energy levels of light positive holes and heavy positive holes display a wider spread therebetween; consequently, there arise two advantages: a lower laser threshold and improved operational efficiency.

As for 1.3 µm InGaAsP quantum well laser active layers, however, tensile strains above 1.0% are not introduced thereinto because it is believed that only a tensile strain exceeding 1.0% can produce phase-separation of InGaAsP compound into InP, GaAs etc. to thereby destroy the crystalline characteristics, as described in "III–V Group Semiconductor Phase Separation" presented by H. Nagai, S. Adachi and T. Fukui, published from Cornoa Corp, pp117–118, in which it is stated that InGaAsP compound suffers from phase-separation at a temperature within the curve of the isothermal line for the tensile strained InGaAsP, as will be detailed later.

SUMMARY OF THE INVENTION

In view of the foregoing, it is an object of the present invention to provide a 1.3 µm tensile strain quantum well laser having a low laser threshold.

According to the present invention, a quantum well laser is provided, which has an InP substrate, and at least one InGaAsP quantum well laser active layer overlying the InP substrate, the active layer having a tensile strain between 1.0% and about 1.5%.

In accordance with the present invention, the InGaAsP quantum well laser lasing at a wavelength of around 1.3 µm has an excellent low threshold as compared to a conventional one.

BRIEF DESCRIPTION OF THE DRAWINGS

Other and further objects, features and advantages of the present invention will be more apparent from the following description, referring to the accompanying drawings as follows.

DESCRIPTION OF THE PREFERRED EMBODIMENTS

Figure 1:
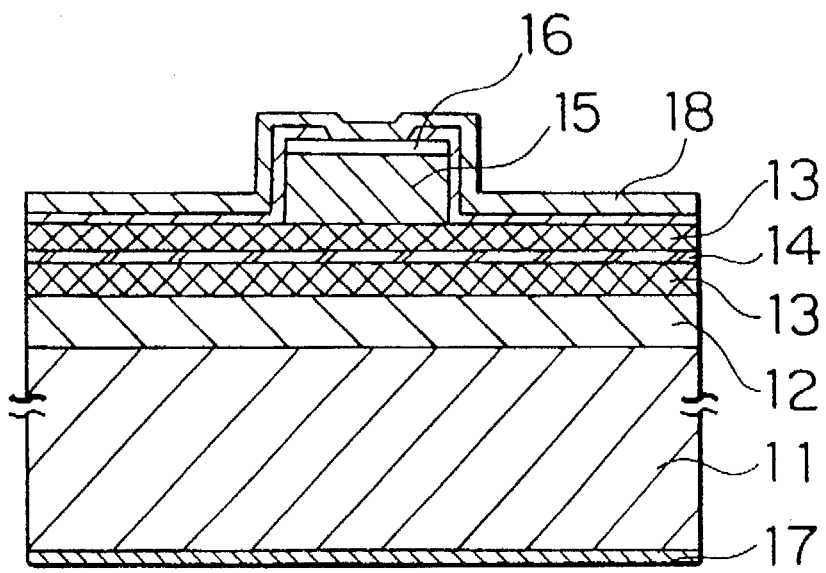
FIG. 1 is a cross-sectional view of an example of a 1.3 µm quantum well semiconductor laser according to an embodiment of the present invention.

Referring to FIG. 1, a semiconductor laser according to an embodiment of the present invention has an n-type InP substrate 11, laminates 12 to 16 formed on the main surface of the InP substrate 11, and metallic electrode layers 17 and 18 formed on the back surface of the InP substrate 11 and on the laminates, respectively.

The laminate formed on the substrate 11 includes an n-type InP cladding layer 12 having a thickness of 0.5 µm, a lower optical confinement layer 13, an InGaAsP single quantum well active layer having a thickness of 12 nm (nanometers), an upper optical confinement layer 13, a p-type InP cladding layer 15 having a thickness of 2 µm, a p-type InGaAs contact layer 16, which are consecutively formed on the InP substrate 11.

Figure 2:
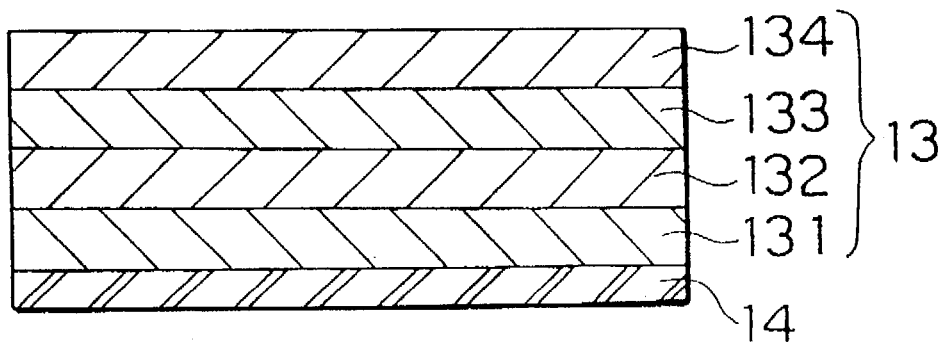
FIG. 2 is a cross-sectional view of one of the optical confinement layers in FIG. 1.

Each of the first and second optical confinement layers 13, as shown in FIG. 2, includes first through fourth sublayers 131 through 134 as numbered consecutively from the interface between the one of the optical confinement layers 13 and the active layer 14. Each of the first through fourth sublayers 131 through 134 is composed of InGaAsP compound having a lattice structure matched with the lattice structure of the InP substrate 11 and has a thickness of 40 nm. The first through fourth sublayers 131 through 134 have bandgap wavelengths of 1.1, 1.05, 1.0 and 0.95 µm, respectively.

In the present embodiment, the quantum well active layer 14 has a tensile strain of not lower than 1.0% so as to reduce the laser threshold. Preferably, the quantum well active layer 14 has a tensile strain of not lower than about 1.2% to obtain a further reduced and stable laser threshold. If the tensile strain of the quantum well active layer 14 is more than 1.5%, laser lasing was not obtained although the reason could not be clarified. Accordingly, the quantum well active layer should have a tensile strain not more than about 1.5%.

Moreover, the increase of the tensile strain in the quantum well active layer lowers the critical maximum thickness thereof for enabling the laser to lase. Accordingly, the tensile strain should not be more than about 1.5% in this view point to obtain a sufficient amplitude of the lasing. Preferable tensile strain is not more than about 1.4% in the view of a stable lasing.

In order to obtain a tensile strain ranging between 1% and 1.5%, the quantum well active layer should have a composition of $In_{1-x}Ga_xAs_yP_{1-y}$ wherein x and y are between 0.42 and 0.55 and between 0.6 and 0.75, respectively. Also, in order to obtain a preferable tensile strain ranging between 1.2% and 1.4%, x and y should be between 0.45 and 0.5 and between 0.6 and 0.75 in the composition as described above.

The critical thicknesses of the 1.3 μm InGaAsP active layer having a tensile strain of 1.0% and about 1.5% generally reside at about 35 nm and between 10 and 15 nm, respectively. When a multiple quantum well laser is designed, the total thickness of the quantum well layers should not, in general, exceed the critical thicknesses as described above. However, compressive strains of the barrier layers, if introduced thereto, would cancel the tensile strains of the quantum well active layers to avoid misfit dislocations due to the lattice mismatch, thereby obtaining high chrystalline quality tensile strained quantum well layers even if a total thickness exceeds the critical thicknesses as described above.

If each of quantum well layers has a thickness of less than 10 nm, quantum size effect will reduce the difference between the energy levels of light positive holes and heavy positive holes, thereby cancelling the advantages of the tensile strain. Accordingly, each of the quantum well layers should have a thickness of not less than 10 nm.

Figure 3:
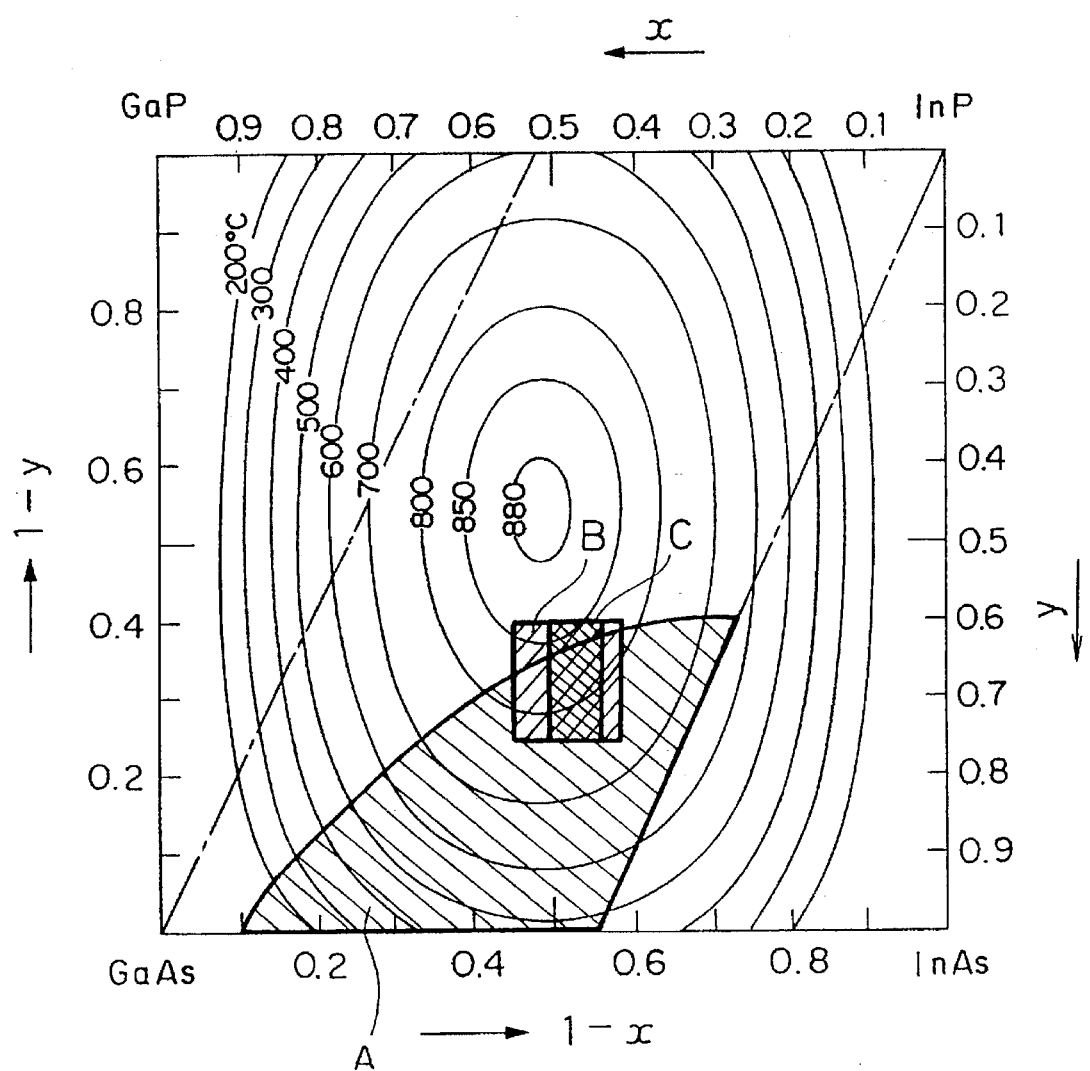
FIG. 3 is a compositional diagram of InGaAsP compound.

FIG. 3 is a compositional diagram of $In_{1-x}Ga_xAs_yP_{1-y}$ compound for showing the unstable region of the compound known in the prior art and the composition of the inventive InGaAsP active layer. InGaAsP active layer having a composition within segment region A in the drawing is generally known to lase at around 1.3 μm wavelength. However, the compositional region including the segment region A is also known to have crystalline unstableness when grown at a temperature within the isothermal curves as illustrated. Moreover, the critical maximum thickness of the active layer in a tensile strained active layer prevented the active layer from lasing at around 1.3 μm wavelength. Accordingly, 1.3 μm wavelength InGaAsP has not been fabricated in the prior art.

In FIG. 3, rectangular region B for the inventive active layer corresponds to the composition of $In_{1-x}Ga_xAs_yP_{1-y}$ wherein $0.42 \leq x \leq 0.55$ and $0.6 \leq y \leq 0.75$ while rectangular region C corresponds to the composition of $In_{1-x}Ga_xAs_yP_{1-y}$ wherein $0.45 \leq x \leq 0.5$ and $0.6 \leq y \leq 0.75$. We successfully fabricated the 1.3 μm wavelength InGaAsP active layers within the segment region A overlapping the rectangular regions B and C, which may be attributed to the thicknesses of the active layers as described above.

To ensure the advantages of the present invention, samples including examples of the embodiment and comparative examples were fabricated and tested, each of which had a structure shown in FIG. 1. Each of the samples had a resonator in which the resonant length thereof is 2000 μm and the facet reflectance is 30% at both sides of the resonator. The growth temperature of those samples ere selected at 800° C. The preferable growth temperature ranges between 580° and 650° C. Table 1 lists the results of the comparison by showing threshold current densities obtained by those samples in association with the tensile strain of the quantum well layers.

TABLE 1

|  | Sample Number | Tensile Strain (%) | Threshold Curr. Density (kA/cm$^2$) |
| --- | --- | --- | --- |
| Embodiments | No. 1 | 1.0 | 0.19 |
|  | No. 2 | 1.2 | 0.15 |
|  | No. 3 | 1.4 | 0.18 |
| Comparative Examples | No. 1 | 0.4 | 1.29 |
|  | No. 2 | 0.8 | 0.35 |
|  | No. 3 | 1.6 | not lased |

From the table, it is confirmed that a tensile strain of not lower than 1.0% provides a threshold current density as low as 0.2 kA/cm2 or less. Comparative example No. 3 having a large tensile strength of 1.6% did not lase, which was not clearly interpreted. However, it is believed that the large tensile strain changed the type-I quantum well laser into type-II quantum well laser, so that laser current was not confined within the quantum well laser.

Since above embodiments are described only for examples, the present invention is not limited to such embodiments and it will be obvious for those skilled in the art that various modifications or alterations can be easily made based on the above embodiments within the scope of the present invention.

For example, in the embodiments as described above, a single quantum well layer is described. However, the present invention is not limited to the single quantum well laser, but extended to a multiple quantum well laser.

What is claimed is:

1. A semiconductor laser comprising an InP substrate and at least one InGaAsP quantum well laser active layer overlying said InP substrate, said laser active layer having a tensile strain between 1.0% and approximately 1.5%, wherein said laser active layer is constituted substantially of $In_{1-x}Ga_xAs_yP_{1-y}$, given x: between 0.42 and 0.55, y: between 0.6 and 0.75.

2. A semiconductor laser as defined in claim 1, which lases at 1.3 μm in wavelength.

3. A semiconductor laser comprising an InP substrate and at least one InGaAsP quantum well laser active layer overlying said InP substrate, said laser active layer having a tensile strain between 1.2% and approximately 1.5%, wherein said laser active layer is constituted substantially of $In_{1-x}Ga_xAs_yP_{1-y}$, given x: between 0.45 and 0.5, y: between 0.6 and 0.75.

4. A semiconductor laser as defined in claim 3, which lases at 1.3 μm in wavelength.

* * * * *